United States Patent
Calascibetta

(10) Patent No.: US 12,048,099 B2
(45) Date of Patent: Jul. 23, 2024

(54) ELECTRONIC DEVICE COMPRISING SURFACE-MOUNT DEVICE TYPE DIPOLES, AND CORRESPONDING ASSEMBLY METHOD

(71) Applicant: STMicroelectronics (Grenoble 2) SAS, Grenoble (FR)

(72) Inventor: Pierino Calascibetta, Fontaine (FR)

(73) Assignee: STMicroelectronics (Grenoble 2) SAS, Grenoble (FR)

( * ) Notice: Subject to any disclaimer, the term of this patent is extended or adjusted under 35 U.S.C. 154(b) by 442 days.

(21) Appl. No.: 17/193,702

(22) Filed: Mar. 5, 2021

(65) Prior Publication Data
US 2021/0289630 A1  Sep. 16, 2021

(30) Foreign Application Priority Data

Mar. 12, 2020 (FR) ........................... 2002455

(51) Int. Cl.
*H05K 1/18* (2006.01)
*H01Q 1/22* (2006.01)
*H01Q 9/16* (2006.01)
*H05K 1/11* (2006.01)

(52) U.S. Cl.
CPC .............. *H05K 1/184* (2013.01); *H01Q 1/22* (2013.01); *H01Q 9/16* (2013.01); *H05K 1/115* (2013.01); *H05K 1/183* (2013.01); *H05K 2201/10098* (2013.01); *H05K 2201/10734* (2013.01)

(58) Field of Classification Search
CPC ........ H05K 1/183; H05K 1/115; H05K 1/184; H05K 1/18; H01Q 9/16; H01Q 1/22
USPC .......................................................... 361/761
See application file for complete search history.

(56) References Cited

U.S. PATENT DOCUMENTS

| 5,164,699 A | 11/1992 | Smith et al. |
| 2002/0100611 A1 | 8/2002 | Crockett et al. |
| 2009/0080168 A1 | 3/2009 | Sugino |
| 2015/0271923 A1* | 9/2015 | Shimabe .............. H05K 3/4602 174/251 |

FOREIGN PATENT DOCUMENTS

WO  2004016056 A1  2/2004

OTHER PUBLICATIONS

INPI Search Report and Written Opinion for FR Appl. No. 2002455 dated Nov. 5, 2020 (9 pages).

* cited by examiner

*Primary Examiner* — Tremesha S Willis
(74) *Attorney, Agent, or Firm* — Crowe & Dunlevy LLC

(57) ABSTRACT

A base substrate has a thickness between two faces. The base substrate includes at least one hole extending in a thickness of the base substrate perpendicular to one of the two face. At least one dipole of a surface-mount device type is housed in the at least one hole of the base substrate.

18 Claims, 4 Drawing Sheets

ELECTRONIC DEVICE COMPRISING SURFACE-MOUNT DEVICE TYPE DIPOLES, AND CORRESPONDING ASSEMBLY METHOD

PRIORITY CLAIM

This application claims the priority benefit of French Application for Patent No. 2002455, filed on Mar. 12, 2020, the content of which is hereby incorporated by reference in its entirety to the maximum extent allowable by law.

TECHNICAL FIELD

Embodiments and implementations relate to electronic devices which comprise surface-mount device (SMD) type dipoles, typically on a face of a base substrate.

BACKGROUND

The base substrates conventionally equipped with surface-mount devices can, for example, be included in BGA (Ball Grid Array) type housings wherein the housing substrate holds and electrically connects an integrated circuit chip with a solder ball array. Alternatively, the base substrates can be of the PCB (Printed Circuit Board) printed circuit type suitable for holding and electrically connecting a set of electronic components together.

Surface-mount device type components of a base substrate are conventionally brazed on the surface of the base substrate and occupy a surface on the base substrate equivalent to the size thereof and/or larger according to the substrate assembly techniques used. These components are electrically connected to various other components, for example integrated circuits of integrated circuit chips, also surface-mounted on the base substrate.

Such arrangements involve problems insofar as the space available on the substrate surface is limited. Furthermore, the spatial requirement on the substrate surface renders the routing of the metal connections between each component difficult, therefore increasing the length of metal to establish an electrical connection. Thus, it is desirable to reduce the spatial requirement on the surface of the base substrates including surface-mount devices.

SUMMARY

According to an aspect, an electronic device comprises a base substrate having a thickness limited by two faces, and at least one dipole of a surface-mount device type, wherein the base substrate includes at least one hole extending in the thickness of the base substrate perpendicularly to one of the faces of the base substrate, and wherein said at least one dipole is housed in said at least one hole of the base substrate.

Thus, by housing a surface-mount device type dipole in a hole, rather than on one of the faces of the substrate, the space occupied on the surface of the base substrate is reduced. Indeed, surface-mount dipoles typically have a cylindrical type shape extending longitudinally. Thus, by housing the dipoles, for example vertically, in holes, the device according to this aspect makes it possible to occupy less space on the surface of the base substrate with respect to the same dipole disposed lengthwise on the surface of the substrate (the length is typically the bulkiest dimension of the dipole).

According to an embodiment, at least one dipole housed in a hole is entirely contained in the hole.

Obviously, "at least one dipole housed in a hole" denotes "at least one dipole from said at least one dipole which is housed in said at least one hole of the base substrate", as defined above.

Indeed, surface-mount type dipoles can have smaller dimensions than the thickness of the substrate. Thus, a dipole entirely contained in a hole (i.e., a hole wherein the ends do not protrude from the hole on the side of the faces of the base substrate) can be coated with a varnish (usually referred to as "solder mask") and optionally another, larger, surface-mount device.

According to an embodiment, the base substrate includes an interconnection grid comprising stacked metal levels in the thickness of the base substrate, and at least one dipole housed in a hole includes terminations, and, a first volume of conductive adhesive on one of the terminations thereof for electrically connecting said termination to at least one metal level of the interconnection grid of the base substrate.

Obviously, the conductive glue fulfils, on one hand, a function of mechanical connection (bonding) of the dipole with the base substrate, and makes it possible, on the other, to jointly establish the electrical connection of the terminations of the dipole with the interconnection grid. This offers the advantage of forming an effective mounting and without adding a major structural modification of the base substrate to establish the electrical connection.

According to an embodiment, the first volume of conductive adhesive electrically connects said termination with an exposed surface, parallel with a face of the base substrate, of the metal level closest to said face.

Thus, the size of the surface whereon the volume of adhesive is applied can be modulated according to a first degree of freedom. This surface forms an electrical and mechanical connection zone between the termination of the dipole, for example located in the thickness of the base substrate and the electrical components on the surface. The size of this surface can make it possible to configure the electrical resistivity and the mechanical resistance of the connection zone.

According to an embodiment, said first volume of conductive adhesive electrically connects said termination with a lateral surface of said at least one metal level, on a flank of the hole housing the dipole.

Thus, the size of the lateral surface whereon the volume of adhesive is applied can be modulated according to a second degree of freedom. Furthermore, this embodiment makes it possible to electrically connect the termination of the dipole with a plurality of metal levels located in the thickness of the substrate, without envisaging vias for coupling the various metal levels conventionally.

According to an embodiment, an integrated circuit chip is mounted on a first face of the base substrate by an electrical chip connection element, and at least one dipole housed in a hole includes terminations, and, on one of the terminations thereof, a second volume of conductive adhesive electrically connecting said termination to the electrical chip connection element.

For example, the electrical chip connection element can be a solder ball of a BEOL (Back End Of Line) interconnection part in the context of a "Flip-Chip" type mounting on the substrate.

Thus, advantageously in terms of reducing the spatial requirement, the integrated circuit chip can be directly coupled with the dipole located in the thickness of the substrate and under the electrical chip connection element.

According to an embodiment, the device includes an external electrical connection element on a second face of the base substrate, wherein at least one dipole housed in a hole includes terminations, and, on one of the terminations thereof, a third volume of conductive adhesive electrically connecting said termination to the external electrical connection element.

Thus, the dipole can be directly coupled with the external electrical connection element, such as an input/output or power supply terminal of the electronic device, for example in the form of a solder ball. Optionally, the dipole can be thus directly connected to components on both faces of the substrate, for example in the context of a double-sided integrated circuit type electronic device.

According to an embodiment, at least one hole housing a dipole, houses several dipoles.

Here again, "at least one hole housing a dipole" denotes "at least one hole from said at least one hole wherein at least one dipole is housed", as defined above Indeed, housing several dipoles in the same hole, for example stacked vertically, makes it possible to multiply the space saved of the substrate by the number of dipoles in the same hole.

According to an embodiment, the dipoles housed in said hole include terminations, and are electrically connected one by one by contact between two respective terminations located in the thickness of the substrate, or by a fourth volume of conductive adhesive located between two respective terminations, in the thickness of the substrate.

The first alternative of this embodiment is advantageous in terms of spatial requirement in the vertical direction, whereas the second alternative is advantageous in terms of electrical coupling between two dipoles, and in terms of mechanical strength.

For example, the base substrate is a printed circuit board or a ball array housing board.

According to a further aspect, a method for assembling at least one dipole, of the surface-mount device type, with a base substrate having a thickness limited by two faces, comprises: drilling at least one hole extending in the thickness of the base substrate perpendicularly to one of the faces of the base substrate; and inserting said at least dipole into said at least one hole.

According to an implementation, at least one dipole is inserted into said at least one hole such that it is entirely contained in said at least one hole.

According to an implementation, wherein at least one dipole housed in a hole includes terminations, the method further comprises: forming a first volume of conductive adhesive on a termination of said at least one dipole housed in a hole, so as to establish an electrical connection of said termination with at least one metal level among the metal levels of an interconnection grid stacked in the thickness of the base substrate.

According to an implementation, said formation of the first volume of conductive adhesive establishes an electrical connection of said termination with an exposed surface, parallel with a face of the base substrate, of the metal level closest to said face.

According to an implementation, said formation of the first volume of conductive adhesive establishes an electrical connection of said termination with a lateral surface of said at least one metal level, on a flank of the hole housing the dipole.

According to an implementation, wherein at least one dipole housed in a hole includes terminations, the method further comprises: mounting an integrated circuit chip, on a first face of the base substrate, by means of an electrical chip connection element; and forming a second volume of conductive adhesive electrically connecting the electrical chip connection element to one of the terminations of said at least one dipole housed in a hole.

According to an implementation, wherein at least one dipole housed in a hole includes terminations, the method further comprises: forming an external electrical connection element on a second face of the base substrate; and forming a third volume of conductive adhesive electrically connecting an external electrical connection element to one of the terminations of said at least one dipole housed in a hole.

According to an implementation, several dipoles are inserted into at least one hole housing a dipole.

According to an implementation, wherein said dipoles housed in the hole include terminations, said dipoles housed in said hole are electrically connected one by one by contact between two respective terminations located in the thickness of the substrate, or by a fourth volume of conductive adhesive located between two respective terminations, in the thickness of the substrate.

According to an implementation, the base substrate is a printed circuit board or a ball array housing board.

BRIEF DESCRIPTION OF THE DRAWINGS

Further advantages and features of the invention will emerge on studying the detailed description of embodiments and implementations, in no way restrictive, and of the appended drawings wherein.

DETAILED DESCRIPTION

Figure 1:
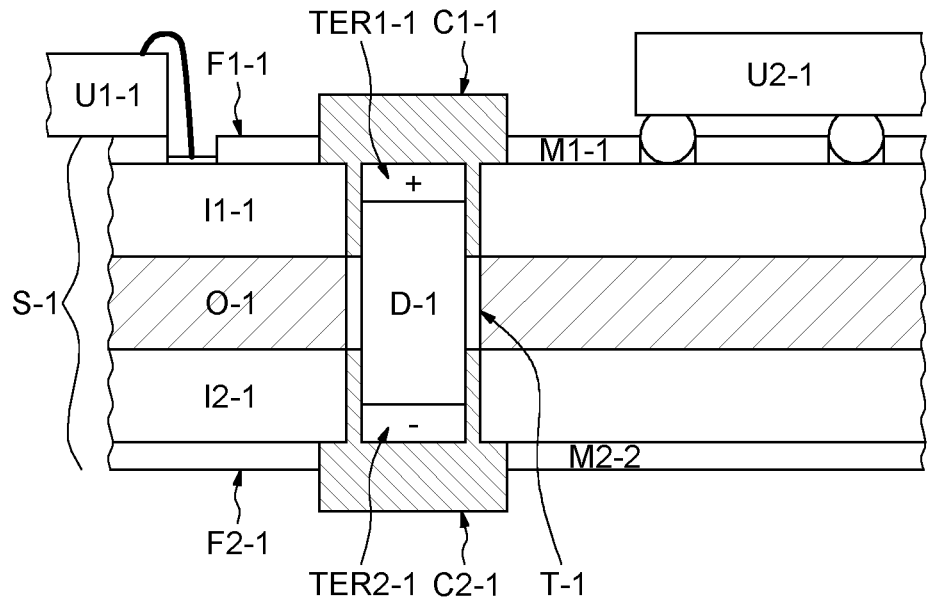
FIG. 1 illustrates an electronic device.

FIG. 1 illustrates an electronic device, comprising a base substrate S-1, in the form of a board, which has a first face F1-1 and a second face F2-1. For example, the base substrate forms a BGA (Ball Grid Array) type integrated circuit housing, or according to a further alternative, a PCB (Printed Circuit Board).

The board of the base substrate S-1 includes an overlay of layers which are disposed symmetrically with respect to a central core O-1 ensuring the rigidity of the base substrate. For example, a first solder mask M1-1, typically a varnish, coats a first metal level I1-1 of an interconnection grid, typically made of copper, formed on a surface of the central core O-1.

Symmetrically with respect to the central core O-1, a second solder mask M2-1 coats a second metal level I2-1 of the interconnection grid, also in contact with the central core O-1.

A hole T-1 traverses the thickness of the base substrate from the first face F1-1 to the second face F2-1, therefore traversing all of the layers of the substrate. The hole T-1 extends perpendicularly with respect to one of the faces F1-1, F2-1 of the base substrate S-1. The hole T-1 is, for example, obtained by drilling using a rotary drill bit, and typically of cylindrical shape.

In a first example, the base substrate is included in a BGA type integrated circuit housing. In this case, the first face F1-1 is the face which includes one or more integrated circuit chips mounted on the base substrate, located inside the integrated circuit housing, and typically coated with a resin and a cap. The second face F2-1 of the base substrate is the face opposite the first face and supports external solder balls of the BGA housing. Other housing technologies than BGA type housings can obviously be envisaged.

In a second example, the base substrate is a PCB printed circuit board, and the first face F1-1 of the base substrate can be the face supporting most of the components mounted on the printed circuit board. The second face of the base substrate F2-1 is the face opposite the first face and, and includes no components, or indeed a minority of components in the case where the PCB printed circuit board is of the "double-sided" type.

A dipole D-1, of the surface-mount device type, has a first termination TER1-1 and a second termination TER2-1. The dipole is inserted entirely into the hole T-1. The terminations of the dipole D-1 are thus located between the two faces F1-1, F2-2 of the base substrate S-1. In the context of this disclosure, the term "dipole" or (reference D-1 for example) will be understood to mean and refer to an electrical circuit component having two electrical terminals (for example, a capacitor, a resistor, a diode, etc.).

Optionally, the dipole D-1 can protrude from the hole T-1, at least one of the terminations of the dipole then protruding from one of the faces of the base substrate S-1.

The dipole D-1 is electrically connected to the interconnection grid of the base substrate S-1 by volumes of conductive adhesive.

Advantages and features of embodiments of first, second, third, and fourth volumes of conductive adhesive will be described hereinafter with reference to FIGS. 1 to 5.

In the example in FIG. 1, a first volume of conductive adhesive C1-1 electrically connects the first metal level I1-1 and a termination TER1-1 of the dipole D-1. As in the example illustrated, the other termination TER2-1 of the dipole D-1 can be connected to another metal level I2-1. Another first volume of conductive adhesive C2-1 then electrically connects the second metal level and I2-1 and the other termination of the dipole D-1.

The first volume of conductive adhesive C1-1 electrically connects the first metal level of the interconnection grid of the substrate and a termination of the dipole D-1 over a flank portion of the hole T-1. Indeed, drilling the hole T-1 has opened a side wall of the metal level, for example of cylindrical shape, delimited by the flank of the hole.

Furthermore, the portion connected by the first volume of conductive adhesive C1-1 further comprises an exposed surface of the metal level I1-1. The surface of the metal level is of typically annular shape and of a diameter greater than a diameter of the hole T-1, and parallel with a face F1-1, F2-1 of the base substrate S-1. By analogy, the other first volume of adhesive can electrically connect the second metal level on metal levels I2-1 in the same way.

One or more electronic chips U1-1, U2-1 can be mounted on the surface of the first face F1-1 of the base substrate S-1. As illustrated by way of example in FIG. 1, a chip can be electrically connected to the first metal level I1-1, for example by a ball (see, chip U2-1) or, a pillar or indeed a metal wire (see, chip U1-1). The electronic chips U1-1, U2-1 then form an electric circuit with the dipole D-1. The dipole D-1 can, for example, be a decoupling capacitor suitable for smoothing the power supply voltage of the electronic chips U1-1, U2-1.

Moreover, any type of electronic components suitable for being mounted on a base substrate can be electrically connected to the dipole D-1.

It is obvious that the dipole D-1 can be electrically connected to one or more electronic components suitable for being mounted on a base substrate, in all the embodiments described hereinafter with reference to FIGS. 2A to 5.

Figure 2A:
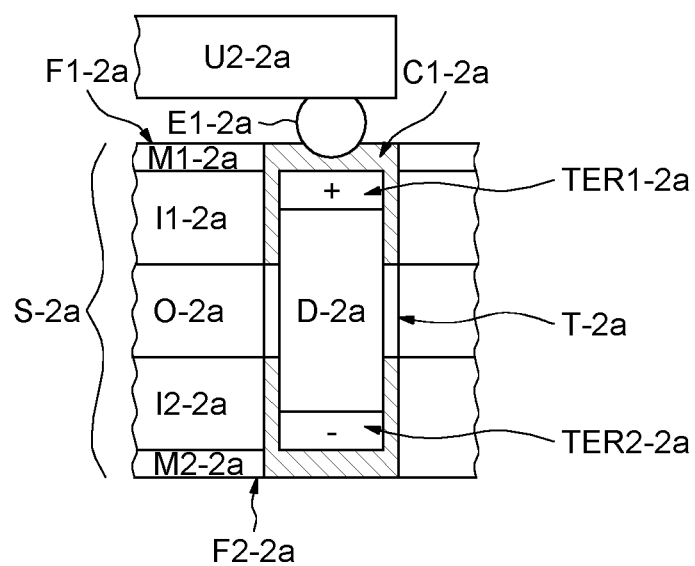
FIGS. 2A-2C illustrate embodiments of the electronic device comprising a surface-mount device type dipole.

FIG. 2A illustrates an embodiment of the electronic device comprising a surface-mount device type dipole D-2a, having a first termination TER1-2a, and a second termination TER2-2a. The dipole D-2a is housed in a hole T-2a drilled in a base substrate S-2a.

The base substrate S-2a has two faces F1-2a, F2-2a, metal levels I1-2a, I2-2a, a core O-2a, and protective layers M1-2a M2-2a of the same types as the corresponding elements described previously with reference to FIG. 1, and respectively referenced F1-1, F2-1, I1-1, I2-1, O-1, TER1-1, TER2-1, M1-1, M2-1. These common elements will not be described again hereinafter.

FIG. 2A illustrates an embodiment wherein an electronic chip U2-2a is disposed on the first face of the base substrate S-2a. The chip U2-2a is of the same type as the chip U2-1 described previously with reference to FIG. 1. The chip U2-2a comprises a chip connection element E1-2a. The connection element E1-2a is electrically connected to a termination TER1-2a of the dipole D-2a inserted into the hole T-2a by a second volume of conductive adhesive C1-2a.

This chip connection element E1-2a can be located above the hole T-2a and aligned in the axis of the hole T-2a, the second volume of adhesive then forms a direct electric path between the electronic chip and the dipole D-2a housed in the hole. Optionally, the chip connection element is coupled with the metallic interconnection grid I1-2a, I2-2a formed in the thickness of the base substrate S-2a. The connection element E1-2a can be a pillar or a connection ball of an integrated circuit chip disposed on the "BEOL" interconnection part of the chip U2-2a.

Figure 2B:
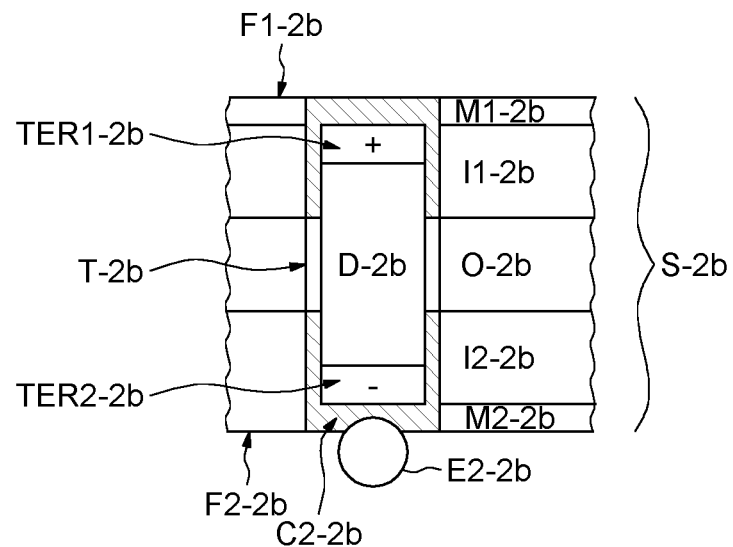

FIG. 2B illustrates an embodiment of the electronic device comprising a surface-mount device type dipole D-2b, having a first termination TER1-2b, and a second termination TER2-2b. The dipole D-2b is housed in a hole T-2b drilled in a base substrate S-2b.

The base substrate S-2b has two faces F1-2a, F2-2a and metal levels I1-2b, I2-2b, a core O-2b and protective layers M1-2b, M2-2b of the same type as the corresponding elements described previously with reference to FIG. 1, and respectively referenced F1-1, F2-1, I1-1, I2-1, O-1, M1-1, M2-1. These elements are common and will not be described again hereinafter.

In the embodiment in FIG. 2B, an external electrical connection element E2-2b disposed on the second face of the base substrate S-2b is electrically connected to the second termination TER2-2b of the dipole D-2b by a second volume of conductive adhesive C2-2b. This external electrical connection element E2-2b can be a solder ball disposed on the second face F2-2b of the base substrate S-2b, for example, in the context of an application of the electronic device in a BGA type housing, a solder ball of the ball array.

Figure 2C:
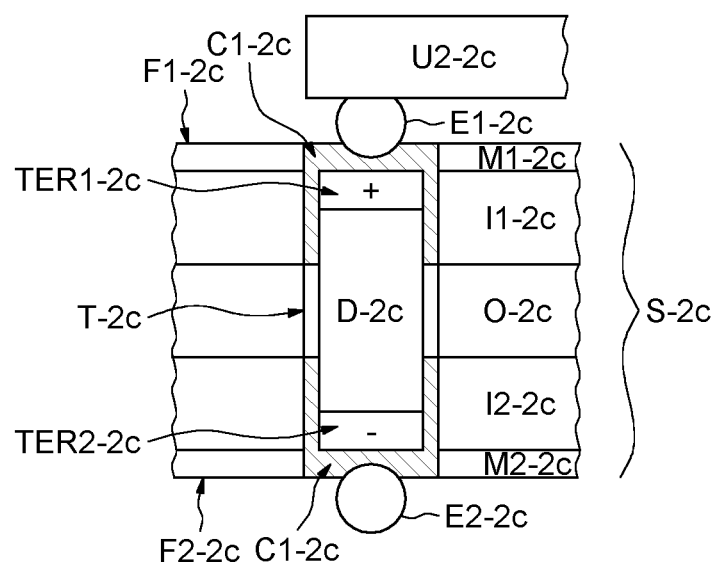

FIG. 2C illustrates an embodiment of the electronic device comprising a surface-mount device type dipole D-2c, having a first termination TER1-2c, and a second termination TER2-2c. The dipole D-2c is housed in a hole T-2c drilled in a base substrate S-2c.

The base substrate S-2c has two faces F1-2c, F2-2c and metal levels I1-2c, I2-2c, a core O-2c and protective layers M1-2c, M2-2c, of the same type as the corresponding elements described previously with reference to FIG. 1, and respectively referenced F1-1, F2-1, I1-1, I2-1, O-1, M1-1, M2-1. These common elements will not be described again hereinafter.

Firstly, an electronic chip U2-2c is disposed on the first face of the base substrate S-2c, comprising a first connection element E1-2c electrically connected to the first termination TER1-2c of the dipole D-2c by a second volume of conductive adhesive C1-2c.

Secondly, an external electrical connection element E2-2c disposed on the second face F2-2c of the base substrate S-2c is electrically connected to the second termination TER2-2c of the dipole D-2c by a second volume of conductive adhesive C2-2c. This dipole can therefore connect elements located on the opposite faces F1-2c, F2-2c of the base substrate.

For example, a serial mounting can successively connect the first chip mounted on the first face F1-2c of the substrate, the dipole D-2c inserted in the hole T-2c, and a second electronic chip mounted on the second face of the substrate S-2c, particularly in the case of an application of the electronic device in a double-sided PCB.

According to a further example, a serial mounting can successively connect the chip mounted on the first face F1-2c of the substrate, the dipole D-2c inserted in the hole T-2c, and a solder ball forming an external electrical connection element of the electronic device, particularly in the case of an application of the electronic device in a BGA type ball array integrated circuit housing.

Figure 3:
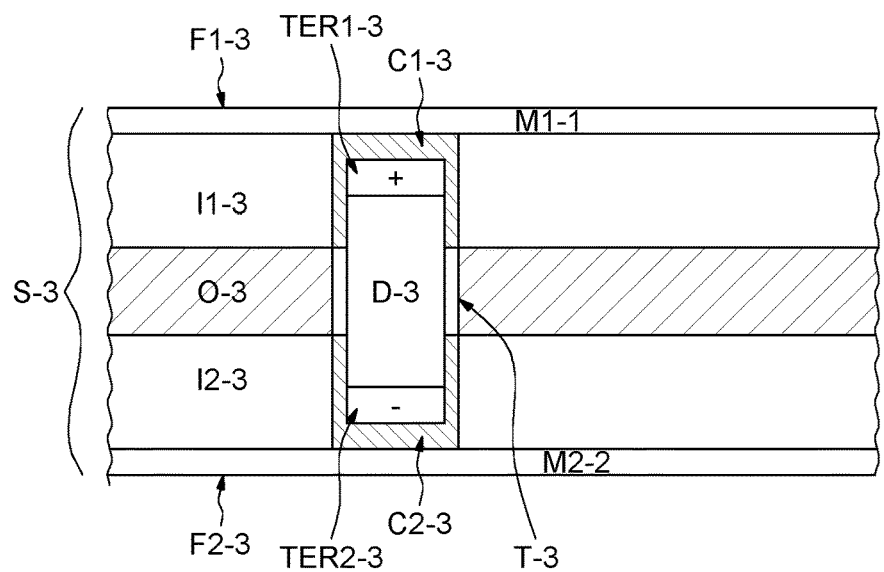
FIG. 3 illustrates an embodiment of the electronic device comprising a surface-mount device type dipole.

FIG. 3 illustrates an embodiment of the electronic device comprising a surface-mount device type dipole D-3, having a first termination TER1-3, and a second termination TER2-3. The dipole D-3 is housed in a hole T-3 drilled in a base substrate S-3.

The base substrate S-3 has two faces F1-3, F2-3, a core O-3 and metal levels I1-3, I2-3 of the same type as the corresponding elements described previously with reference to FIG. 1, and respectively referenced F1-1, F2-1, O-1, I1-1, I2-1. These common elements will not be described again hereinafter.

In the embodiment in FIG. 3, the two faces F1-3, F2-3 of the base substrate S-3 are each coated with a protective layer M1-3, typically a solder mask, sealing the hole T-3 containing the dipole D-3. The two terminations TER1-3, TER2-3, of the dipole are entirely contained in the hole of the substrate, thus the protective layers M1-3, M2-3 coat, and therefore mechanically and electrically protect, the first two volumes of conductive adhesive C1-3, C2-3 connecting the terminations of the dipole D-3 to the respective metal levels M2-3 of the interconnection grid of the substrate S-3.

Obviously, the hole T-3 containing the dipole D-3 can be sealed by the respective protective layer M1-3, M2-3 only on the side of one or the other of the two faces F1-3, F2-3.

Figure 4:
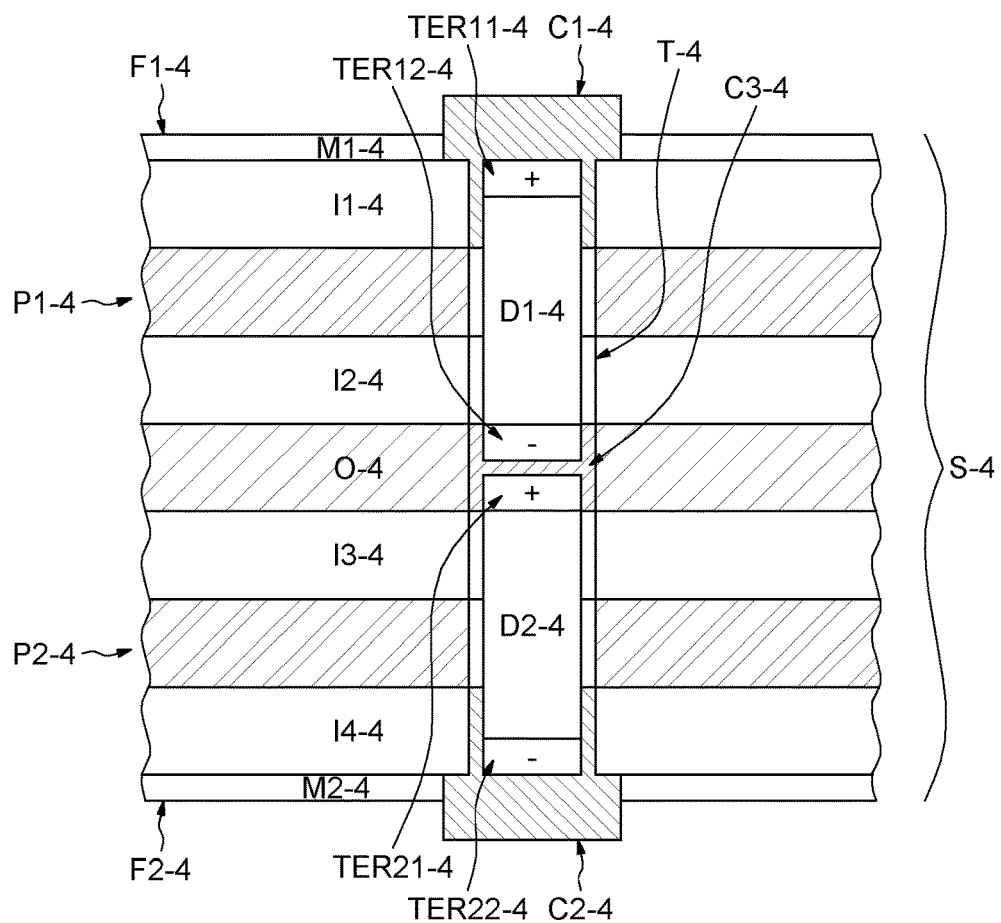
FIG. 4 illustrates an embodiment of the electronic device comprising a surface-mount device type dipole.

FIG. 4 illustrates an embodiment of the electronic device comprising a surface-mount device type dipole D-4, housed in a hole T-4 drilled in a base substrate S-4.

The base substrate S-4 has two faces F1-4, F2-4 and two first volumes of adhesives C1-4, C2-4, a core O-4, and two protective masks M1-4, M2-4 of the same type as the corresponding elements, described previously with reference to FIG. 1, respectively referenced F1-1, F2-1, C1-1, C2-1, O-1, M1-4, M2-4. These common elements will not be described again hereinafter.

Furthermore, the example illustrated in FIG. 4 differs particularly from the example in FIG. 1 in that it comprises four metal levels forming an interconnection grid I1-4, I2-4, I3-4, I4-4, as well as two electrical insulator levels P1-4, P2-4, respectively alternating between each metal level, and symmetrically on either side of the central core O-5.

The electrical insulator levels comprise for example epoxy resin type resin, and fibers, and serve as binder and electrical insulators from one metal level to another.

The hole T-4 traverses this stack of metal levels alternating with the electrical insulator levels.

The number of layers of a base substrate can be greater than the number of layers described herein by way of example.

A first dipole D1-4 comprises a first termination TER11-4, and a second termination TER21-4. The dipole D1-4 is inserted into the hole T-4 of the base substrate.

A second dipole D2-4, of the surface-mount device type, having a similar or different function from the first dipole D1-4 is also inserted into the same hole T-4. The second dipole also comprises a first termination TER11-4 and a second termination TER21-4. The two dipoles can be arranged so as to be aligned lengthwise.

The two dipoles D1-4, D2-4, respectively have two terminations suitable for being inserted entirely into the base substrate S-4. If the thickness of the base substrate permits, more than two surface-mount device type dipoles can be inserted into the hole T-4.

Two first volumes of conductive adhesive C1-4, C2-4 can electrically connect the first metal level I1-4 with a first termination of the first dipole D1-4, and electrically connect the fourth metal level and I4-4 with a second termination of the second dipole D2-4, in the manner described with reference to FIG. 1.

The two dipoles D2-4, D3-4 can be electrically connected to one another by a fourth volume of conductive adhesive C3-4 located at the level of the second termination of the first dipole and the first termination of the second dipole. For example, the two dipoles can thus be mounted in series.

Alternatively, the two terminations of the two dipoles D2-4, D3-4 can be simply in mechanical contact, therefore creating an electrical connection of the serial mounting.

Figure 5:
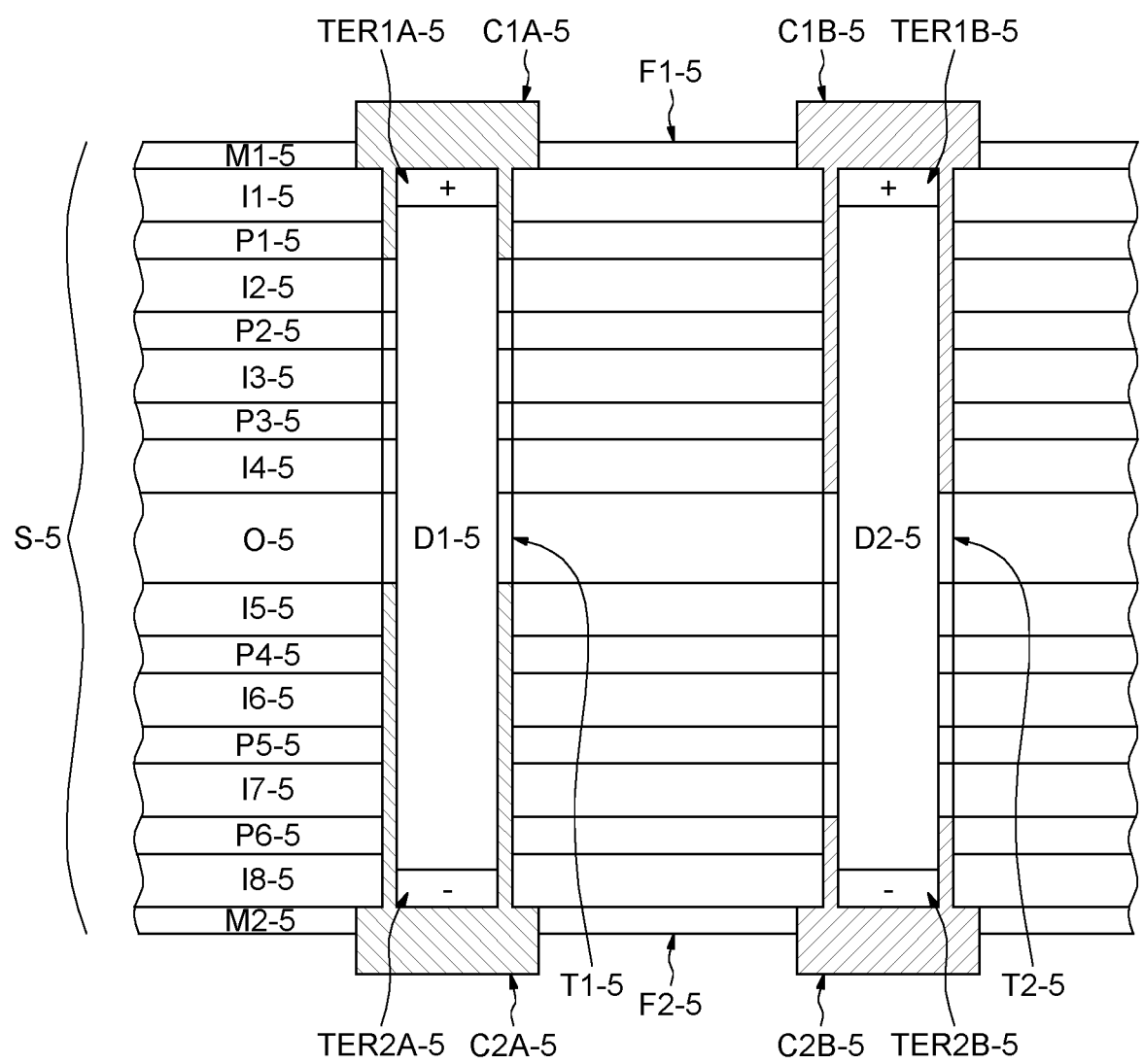
FIG. 5 illustrates an embodiment of an electronic device comprising a plurality of dipoles.

FIG. 5 illustrates an embodiment of an electronic device comprising a first dipole D1-5, and a second dipole D2-5, both of the surface-mount device type, respectively housed in a first hole T1-5 and a second hole T2-5, drilled in a base substrate S-5. The first dipole D1-5 has a first termination TER1A-5, and a second termination TER2A-5. The second dipole D2-5 has a first termination TER1B-5 and a second termination TER2B-5.

The base substrate S-5 has two faces F1-5, F2-5 and two first volumes of adhesives C1A-5, C2B-5, a core O-5, and two protective masks M1-5, M2-5 of the same type as the corresponding elements, described previously with reference to FIG. 1, respectively referenced F1-1, F2-1, C1-1, C2-1, O-1, M1-4, M2-4. These common elements will not be described again hereinafter.

Furthermore, the example illustrated in FIG. 5 differs particularly from the example in FIG. 1 in that the base substrate S-5 comprises eight metal levels forming an interconnection grid I1-5, I2-5, I3-5, I4-5, I6-5, I7-5, I8-5, I9-5, as well as six electrical insulator levels P1-5, P2-5, P3-5, P4-5, P5-5, P6-5, respectively alternating between each metal level, and symmetrically on either side of the central core O-5.

The holes T1-5, T2-5 traverse this stack of metal levels alternating with the electrical insulator levels.

The number of layers of a base substrate can be different from the number of layers described herein by way of example.

A first volume of conductive layer C2A-5 can electrically connect a plurality of successive metal levels of the substrate, to the second termination TER2B-5 of the first dipole D1-5, housed in the first hole T1-5. This first plurality of levels electrically connected to the termination of the first dipole D1-5 is, for example, located in a zone comprised between the core of the substrate and the second face of this base substrate. The first volume of conductive adhesive C2A-5 then also mechanically connects the dipole D1-5 to all of the levels comprised in this zone, also comprising the insulator levels.

Alternatively in the second hole T2-5, a first volume of adhesive C1B-5 can connect in an equivalent manner a second plurality of levels for example located in a zone comprised between the first face F1-5 of the substrate S-5 and the core O-5 of the substrate S-5, with the termination TER2A-5 of the second dipole D2-5.

The invention claimed is:

1. An electronic device, comprising:
    a base substrate having a thickness between a first face and a second face;
    wherein the base substrate includes a hole extending in the thickness of the base substrate perpendicular to said first face;
    a dipole of a surface-mount device type that includes electrical terminations;
    wherein said dipole is housed in said hole of the base substrate; and
    an integrated circuit chip mounted on said first face and including an electrical chip connection element; and
    a volume of conductive adhesive that physically contacts both said one of the electrical terminations of said dipole and said electrical chip connection element of the integrated circuit chip.

2. The device according to claim 1, wherein said dipole is entirely housed in said hole.

3. The device according to claim 1, wherein the base substrate includes an interconnection grid comprising a stack of metal levels in the thickness of the base substrate, and further comprising:
    an additional volume of conductive adhesive that electrically connects another of the electrical terminations to at least one metal level of the stack for the interconnection grid.

4. The device according to claim 3, wherein said additional volume of conductive adhesive electrically connects said another of the electrical terminations with a surface of said at least one metal level of said stack in the hole housing said dipole.

5. The device according to claim 3, wherein said additional volume of conductive adhesive electrically connects said another of the electrical terminations with a lateral surface of said at least one metal level of said stack on a flank of the hole housing said dipole.

6. The device according to claim 1, wherein the base substrate is one of a printed circuit board or a ball array housing board.

7. The device according to claim 1, further including an external electrical connection element on the second face, and further comprising an additional volume of conductive adhesive that electrically connects another of the electrical terminations to the external electrical connection element.

8. The device according to claim 1, wherein the electrical chip connection element is one of a pillar or a connection ball of the integrated circuit chip.

9. An electronic device, comprising:
    a base substrate having a thickness between a first face and a second face;
    wherein the base substrate includes a hole extending in the thickness of the base substrate perpendicular to said first face;
    a first dipole of a surface-mount device type that includes first electrical terminations;
    a second dipole of a surface-mount device type that includes second electrical terminations;
    wherein said first and second dipoles are housed in said hole of the base substrate; and
    a volume of conductive adhesive that electrically connects one of the first electrical terminations of said first dipole to one of the second electrical terminations of said second dipole.

10. The device according to claim 9, wherein said first and second dipoles are entirely housed in said hole.

11. The device according to claim 10, wherein the base substrate includes an interconnection grid comprising a stack of metal levels in the thickness of the base substrate, and further comprising:
    an additional volume of conductive adhesive that electrically connects another of the first electrical terminations to at least one metal level of the stack for the interconnection grid.

12. The device according to claim 11, wherein said additional volume of conductive adhesive electrically connects said another of the first electrical terminations with a surface of said at least one metal level of said stack in the hole housing said first and second dipoles.

13. The device according to claim 11, wherein said additional volume of conductive adhesive electrically connects said another of the first electrical terminations with a lateral surface of said at least one metal level of said stack on a flank of the hole housing said first and second dipoles.

14. The device according to claim 9, wherein the base substrate is one of a printed circuit board or a ball array housing board.

15. The device according to claim 9, further including an external electrical connection element on the second face, and further comprising an additional volume of conductive adhesive that electrically connects another of the first electrical terminations to the external electrical connection element.

16. The device according to claim 9, wherein said volume of conductive adhesive is located in the thickness of the substrate between the first and second faces.

17. An electronic device, comprising:
    a base substrate having a thickness between a first face and a second face;
    wherein the base substrate includes a hole extending in the thickness of the base substrate perpendicular to said first face;
    a dipole of a surface-mount device type that includes electrical terminations;
    wherein said dipole is housed in said hole of the base substrate;
    a first volume of conductive adhesive within said hole that electrically connects one of the electrical terminations of said dipole to one conductive layer of the base substrate;
    a second volume of conductive adhesive within said hole that electrically connects another of the electrical terminations of said dipole to another conductive layer of the base substrate; and a solder mask layer extending over the first face of the base substrate and completely covering the hole extending in the thickness of the base substrate.

18. The device according to claim 17, wherein the base substrate is one of a printed circuit board or a ball array housing board.

\* \* \* \* \*